(12) United States Patent
Kataria

(10) Patent No.: US 7,504,886 B2
(45) Date of Patent: Mar. 17, 2009

(54) THERMAL TAIL COMPENSATION

(75) Inventor: Pankaj Kataria, Ossining, NY (US)

(73) Assignee: Lecroy Corporation, Chestnut Ridge, NY (US)

( * ) Notice: Subject to any disclaimer, the term of this patent is extended or adjusted under 35 U.S.C. 154(b) by 186 days.

(21) Appl. No.: 11/518,678

(22) Filed: Sep. 11, 2006

(65) Prior Publication Data

US 2008/0061883 A1    Mar. 13, 2008

(51) Int. Cl.
*H03F 3/04* (2006.01)

(52) U.S. Cl. .......................... 330/289; 330/256

(58) Field of Classification Search ............... 330/256, 330/266, 272, 289, 252, 295
See application file for complete search history.

(56) References Cited

U.S. PATENT DOCUMENTS

| 3,659,117 A | 4/1972 | Caveney et al. |
| 3,668,541 A | 6/1972 | Pease |
| 4,528,516 A | 7/1985 | Hill, III |
| 4,572,967 A | 2/1986 | Metz |
| 4,755,766 A | 7/1988 | Metz |
| 5,483,199 A | 1/1996 | Knudsen |
| 5,977,832 A | 11/1999 | Satyanarayana et al. |
| 6,784,746 B1 | 8/2004 | Wuppermann |
| 2005/0035821 A1 | 2/2005 | Everton et al. |
| 2008/0061877 A1* | 3/2008 | Adut .......................... 330/256 |

* cited by examiner

*Primary Examiner*—Khanh V Nguyen
(74) *Attorney, Agent, or Firm*—Gordon Kessler

(57) ABSTRACT

A waveform processing system may include a compensation circuit to adjust a voltage supplied to an output stage, wherein a supplied voltage is controlled to substantially maintain constant power dissipation in the output stage, and wherein the compensation circuit is configurable independently from the amplification stage. In an illustrative embodiment, a control circuit may be independently configurable with respect to an amplifier that generates a signal for the output stage, and the control circuit may bias a compensation circuit that provides thermal tail compensation for an output stage transistor. In some embodiments, the bias may operate the compensation circuit (i) to maintain a substantially constant power condition in the output stage transistor to substantially reduce thermal tail effects, and (ii) to maintain the output stage transistor in an unsaturated operating condition.

23 Claims, 4 Drawing Sheets

THERMAL TAIL COMPENSATION

TECHNICAL FIELD

Various embodiments relate to thermal tail compensation, and particular embodiments relate to improved transient response of emitter followers during and after large amplitude current transients.

BACKGROUND

Oscilloscopes are tools that engineers often use to measure signals from electronic devices. Oscilloscopes may be used to view analog or digital waveforms in a circuit, for example. Circuit signals may be tapped using voltage or current probes that are coupled to an oscilloscope.

When received at an oscilloscope input, a waveform is typically conditioned by various filters and amplifiers. In a typical digital oscilloscope, the waveform is sampled and converted to a digital representation, and then either displayed or stored in a memory device.

Prior to conversion from an analog waveform to a digital representation, input signals may be, for example, buffered, amplified, and/or level shifted by signal conditioning circuitry. Some signal conditioning circuits may have a relatively high impedance input to minimize loading of the input signal. After being conditioned, the input signal may be sampled. For example, a track and hold circuit may be used to sample a signal by capturing a signal voltage on a capacitor.

Achieving high bandwidth in a digital oscilloscope generally involves fast sampling. Accordingly, some signal conditioning circuits may include transistor circuits to facilitate rapid charging of a capacitor in the sampling circuit.

At certain signal frequencies, transistor circuits can exhibit a significant "thermal tail" effect due to temperature changes that may result from changes in the power dissipation. In the signal conditioning circuitry of a digital oscilloscope, for example, thermal tail effects can distort some signals before the signals are sampled. As such, thermal tails can result in sampled waveforms that include a thermal tail component in addition to features of the original input signal waveform.

SUMMARY

A waveform processing system may include a compensation circuit to adjust a voltage supplied to an output stage, wherein a supplied voltage is controlled to substantially maintain constant power dissipation in the output stage, and wherein the compensation circuit is configurable independently from the amplification stage. In an illustrative embodiment, a control circuit may be independently configurable with respect to an amplifier that generates a signal for the output stage, and the control circuit may bias a compensation circuit that provides thermal tail compensation for an output stage transistor. In some embodiments, the bias may operate the compensation circuit (i) to maintain a substantially constant power condition in the output stage transistor to substantially reduce thermal tail effects, and (ii) to maintain the output stage transistor in an unsaturated operating condition.

In an exemplary embodiment, the thermal tail compensation circuit may be biased to prevent a base-collector junction of a bipolar junction transistor (BJT) from becoming temporarily forward biased by current spikes caused by, for example, switching a capacitive load into an output stage. In one example, the output stage transistor may be configured as an emitter follower. In some embodiments, the control circuit may substantially track operation of the amplifier that generates a signal for the output stage.

Some embodiments may have one or more advantages. For example, various embodiments may provide improved transient response, which may include robust performance during and after current transients. Various implementations may provide thermal tail compensation without saturating the output stage transistor in the wake of large amplitude current spikes. A control circuit decoupled from the signal path may be independently controllable, and may afford flexibility in designing the control circuit in a variety of implementations. Some embodiments may include control inputs received from outside of an integrated circuit, for example. Moreover, the control circuits, in various embodiments, may substantially avoid loading amplification stages in the main signal path. Accordingly, bandwidth, transient response, and/or amplitude fidelity of waveform processors may be improved at low cost in some applications.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION OF ILLUSTRATIVE EXAMPLES

Figure 1:
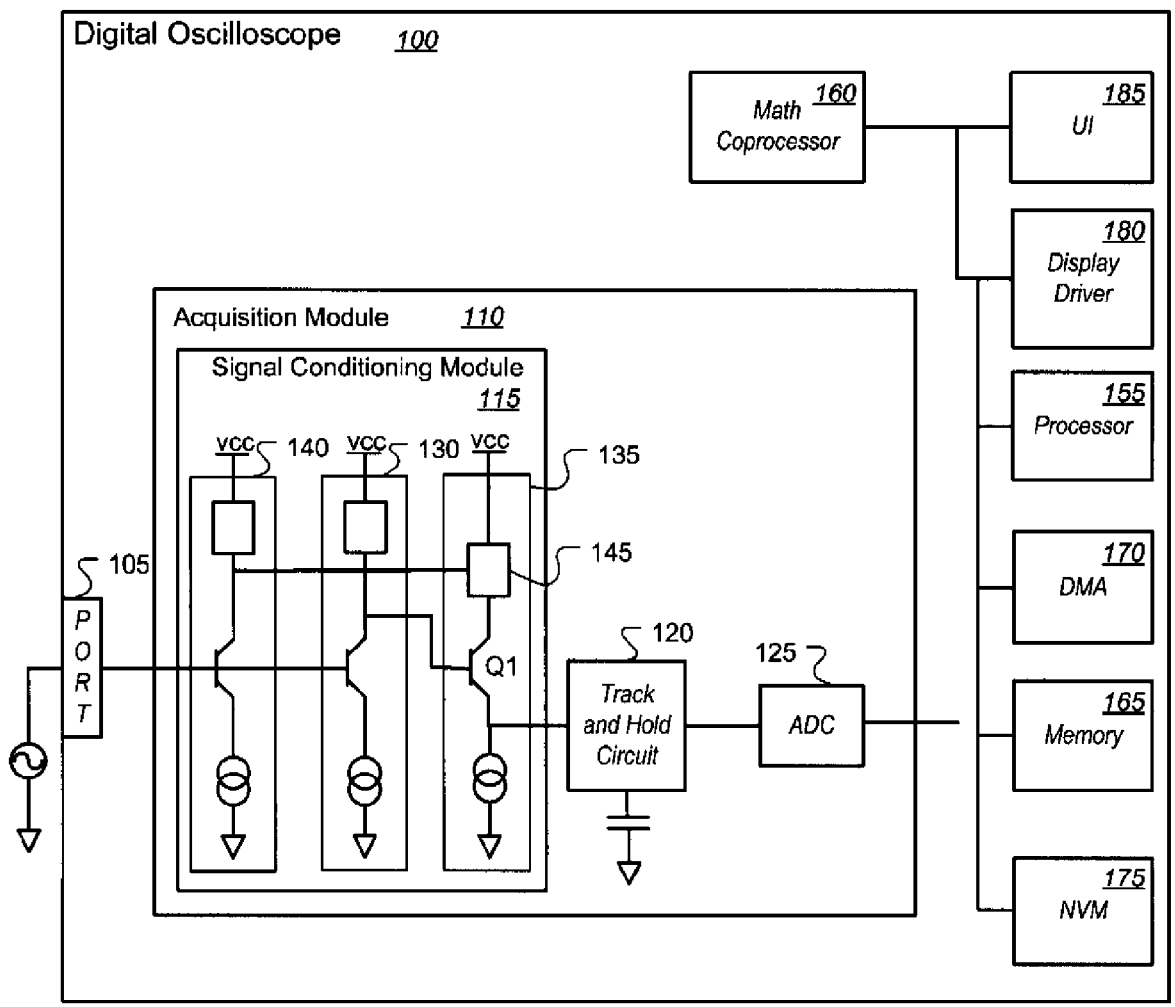
FIG. 1 shows an exemplary digital oscilloscope that includes a control circuit to generate a bias signal for a thermal tail compensation circuit in an emitter follower stage.

FIG. 1 shows an exemplary digital oscilloscope 100 to acquire, process, and display electromagnetic signal waveforms. The digital oscilloscope 100 is arranged to receive an input signal through an input port 105. The input signal is processed by an acquisition module 110. The acquisition module 100 includes thermal tail compensation circuitry configured to reduce gain variations associated with thermal tail effects in an emitter follower circuit. The thermal tail compensation circuitry is designed to substantially avoid loading effects on the output of the amplifier circuit. A de-coupled feed forward control circuit provides flexibility in biasing the thermal compensation circuit. The control circuit can bias the thermal tail compensation circuit to substantially avoid saturation of the emitter follower transistor as a consequence of high transient currents. High transient current may be caused by, for example, switching a capacitive load onto the output of an emitter follower. Switching a capacitive load can draw a charging current through the emitter follower transistor.

The input port 105 is connected to an external signal source via a probe or a pin. The acquisition module 110 processes the input signals and then outputs a digital representation of the input signal to a digital processing system. The acquisition module 110 includes a signal conditioning module 115, a track and hold circuit 120, and an analog to digital converter (ADC) 125. The signal conditioning module 115 may provide, for example, voltage level shifting, controlled input or output impedance, amplification, buffering, single-ended to differential or differential to single-ended conversion, and/or other processing or filtering functions.

After being conditioned by the module 115, the signal is processed by the track and hold circuit 120. The track and hold circuit 120 may store an output voltage of the emitter follower circuit 135. In one state of operation, the track and hold circuit 120 substantially tracks the output signal of the emitter follower 135. In a second state of operation, the track and hold circuit 120 substantially maintains or holds the voltage of the output signal of the emitter follower 135 at a particular moment. In some embodiments, a sample and hold circuit may be substituted for the track and hold circuit 120. The output of the track and hold circuit 120 is typically a held voltage signal, but could also be a current signal, for example.

The output of the track and hold circuit 120 is an input to the ADC 125, which may convert the held voltage signal to a digital representation of the analog input signal. The digital representation may be subsequently stored in a memory device, or output on a digital bus for storage and/or further processing.

In the depicted example, the signal conditioning module 115 includes an amplifying circuit 130, an emitter follower circuit 135, and a control circuit 140. The amplifying circuit 130 and the emitter follower circuit 135 are illustrative of signal processing circuitry that may provide, for example, improved signal-to-noise ratio, level shifting, buffering, and amplification. The control circuit 140 provides a bootstrapping signal to operate a thermal tail compensation circuit 145 so that the emitter follower circuit 135 substantially maintains its transient performance during and after transient current spikes. Although represented for simplicity as single-ended circuits, part or all of the circuits 130, 135, 140 may be, for example, single-ended and/or differential.

In an illustrative example, the signal conditioning module 115 may operate to condition a voltage signal received at the input port 105. In particular, the amplifying circuit 130 may provide voltage amplification with a high input impedance, and the emitter follower circuit 135 may provide voltage buffering with a low output impedance. Low output impedance may provide faster transient response and higher bandwidth for tracking signals containing high frequency content. Upon receiving a trigger event, such as an external trigger signal or an internal clock signal, a capacitor in the track and hold circuit 120 may be charged and discharged by the emitter follower 135 according to variations in the input signal.

Achieving high signal fidelity over a wide bandwidth calls for, in various examples, an emitter follower 135 with good transient response characteristics at the frequencies or over the frequency range(s) of interest. In a typical emitter follower, the transient response performance may be degraded by thermal tail effects.

To mitigate thermal tail effects, the emitter follower 135 includes a thermal tail compensation circuit 145. The thermal tail compensation circuit 145 may be configured so that the output transistor (Q1) of the emitter follower 135 operates in a substantially constant power mode. For example, some compensation circuits may be configured to maintain a substantially equality between the voltages on the collector and base of the transistor Q1 under certain operating conditions. Operating the transistor Q1 in a substantially constant power mode will substantially reduce changes in the power dissipation. Maintaining substantially constant power dissipation in the transistor Q1 may substantially reduce the impact of thermal tail effects on transient performance of the emitter follower 135.

However, in some applications, the output of an emitter follower circuit that includes a thermal tail compensation circuit may be coupled through a switch element to a load that appears capacitive. Switching a capacitive load to a low impedance output provides the potential for current surges, which may be referred to as current spikes, from the emitter follower to the capacitive load. As an illustration, the larger the difference between the emitter follower output voltage and the capacitor voltage when a switch connected there between is closed, the larger the amplitude of a potential current spike through the transistor Q1. The amplitude may also increase with the capacitance value.

In some embodiments, voltage differences may cause current spike transients that are large enough to momentarily forward bias a base-collector (B-C) junction of the transistor Q1. The B-C junction may be partially or fully forward biased. Forward biasing the B-C junction can result in a finite transistor recovery time during which response of the emitter follower 135 is delayed and the output signal is distorted. Over some frequencies, the corresponding performance degradation may cause erroneous data and/or loss of signal integrity, for example, in the measurements made by the digital oscilloscope 100.

In some implementations, two or more emitter follower circuits 135 may be connected in series after the amplifier 130, for example, to reduce loading on the amplifier 130. In one example, a compensation circuit 145 is associated with each emitter follower circuit 135 following the first emitter follower circuit 135. For example, a base input signal of a compensation circuit 145 associated with a second emitter follower circuit 135 may be coupled to a signal at an output (e.g., emitter) of the thermal compensation circuit 145 in the first emitter follower circuit 135. Each successive thermal compensation circuit 145 may be biased by the output signal of the previous emitter follower circuit 135. In some implementations, the same signal, for example, may be used to bias the thermal compensation circuits of more than one cascaded emitter follower stage.

As will be described in further detail with reference to FIG. 2, the control circuit 140 generates a bootstrapping signal to bias the thermal compensation circuit 145. The compensation circuit 145 may use the bootstrapping signal to substantially mitigate thermal tail effects in the emitter follower circuit 135. At least steady state conditions, for example, the compensation circuit 145 may provide a collector voltage to the transistor Q1 to maintain a substantially constant collector-to-base (Vcb) or a substantially constant collector-to-emitter voltage (Vce) on the transistor Q1.

In some embodiments, the compensation circuit 145 and the control circuit 140 may control the offset or bias on the bootstrapping signal to the emitter follower circuit 135 to substantially avoid forward biasing or saturating a base collector voltage of an NPN bipolar junction transistor (BJT) in the emitter follower circuit 135. For example, the control circuit 140 may operate to provide a bias signal that not only causes the thermal compensation circuit to maintain a constant power condition in the transistor Q1, but also maintains the transistor Q1 in an unsaturated operating condition during operation, including during and after spikes of current that may result, for example, from switching a capacitive load across the output of the emitter follower 135.

The compensation circuit 145 may receive a thermal compensation signal to control voltage supply in the emitter follower circuit 135 so that the emitter follower circuit 135 may operate in a constant power condition. In some embodiments, the control circuit 140 may monitor operating conditions (e.g., in voltage, current, and/or temperature) in the amplifying circuit 130 and generate an appropriate control signal to the compensation circuit 145 based on the operating conditions. In the depicted embodiment, the control circuit 140 is implemented as an amplifier circuit that is in parallel with the amplifying circuit 130 and that receives the same input signal as the amplifying circuit 130. In some implementations, the control circuit 140 may include electrical components configured to approximately model, or simulate operation of the amplifying circuit 130. The control circuit 140 may generate a different response, for example by outputting an elevated bias voltage to the compensation circuit 145 to improve performance of the emitter follower circuit 135.

Various embodiments may be implemented in single ended and/or differential circuits. For simplicity of explanation, while the circuits 130, 135, 140 are shown in differential form in FIG. 2, they are shown in single-ended form in FIGS. 3 and 4. One of ordinary skill in the art will recognize how to translate the illustrated single ended circuits to corresponding differential circuits.

The ADC 125 may read the voltage held on the capacitor in the track and hold circuit 120 and convert the read analog signal into digital samples for processing and storage. For example, the ADC 125 may repeatedly digitize the amplitude of an input signal.

The oscilloscope 100 of this example also includes a processor 155 and a math coprocessor 160. The processor 155 and/or coprocessor 160 may perform various functions, such as supervisory, user interface, signal processing, and signal analysis, in support of the digital oscilloscope 100 operations. For example, the processor 155 may supervise various operations, such as waveform data collection and user interaction. The math coprocessor 160 may include one or more of the following: an ASIC (application specific integrated circuit), DSP (digital signal processor), discrete or integrated analog and/or digital circuits, and a dedicated digital logic architecture to perform mathematics functions, for example. The math coprocessor 160 may cooperate with the processor 155 to perform various functions. For example, the math coprocessor 160 may perform operations that include floating point arithmetic, signal processing, digital filtering (e.g., IIR, FIR) and/or numerical operations (e.g., curve fitting, numerical derivative computation, numerical integration, fast Fourier transformation (FFT), and interpolation).

In some embodiments, the processors 155 and/or 160 may monitor and/or dynamically adjust the operations of the compensation circuit 145 and/or the control circuit 140. For example, the processor 155 may monitor voltage changes in the emitter follower circuit 135 and adjust various parameters, for example, input voltage, current, and/or resistance values associated with the control circuit 140 to improve performance of the compensation circuit 145, the control circuit 140, and/or the emitter follower circuit 135. Exemplary adjustment mechanisms are described in further detail with reference to FIGS. 2-4.

In the exemplary oscilloscope 100, the processor 155 is coupled through a digital bus to memory devices, including a memory 165, a Direct Memory Access (DMA) controller 170, and a non-volatile memory (NVM) 175. The NVM 175 may provide a storage space for storing data (e.g., sampled waveform data acquired by the acquisition module 110) and/or executable instructions (e.g., application software). NVM 175 may include, for example, flash memory, read only memory (ROM), EEPROM, data storage devices with rotating media (e.g., optical or magnetic disc drive), tape storage devices, or any combination of such devices. The memory 165 may provide temporary storage for the sampled signal data from the acquisition module 110. The memory 165 may be, for example, RAM, a buffer, or cache memory, which may provide volatile data storage. For example, the memory 165 may store the data for an eye diagram generated from a repetitive bit pattern, and store a corresponding persistence map that provides data for each bit interval in the pattern. The DMA 170 may handle accesses of the memory 165 without direct involvement of the processors 155, 160. For example, the DMA 170 can move data from one memory location to another memory location. In another example, the DMA 170 may be configured to move samples of the input signal from the acquisition module 110 directly into sequential memory locations, such as an array in the memory 165 and/or the NVM 175, for subsequent signal analysis.

In this example, the NVM 175 is coupled to the processor 155 by a digital address/data bus. The processor 155 may execute instructions and retrieve information stored in the NVM 175 via the bus. The NVM 175 may include a number of code modules (not shown) to perform measurement operations, including operations to support operations (e.g., user interface, boot-up, configurations, etc.) of the oscilloscope 100.

The digital oscilloscope 100 also includes a display driver 180 and a user interface (UI) 185. The display driver 180 may format and send images for display on a display device (not shown) in the UI 185. For example, the display driver 180 can send for display overlapping samples of a signals received from the input port 105. An operator can also use the UI 185 to input commands and/or information to set-up and/or control operation of the digital oscilloscope 100.

In some embodiments, the NVM 175 may store some sets of parameters (e.g., supply voltage, reference voltage, current, and/or resistor values for the control circuit 140 and/or the compensation circuit 145). In some examples, the processor 155 may select one set of the parameters from the NVM 175 based on the frequency content of the input signal. As an example, the processor 155 may execute a code that determines the frequency range of interest for the input signal. As another example, the processor 155 may receive the frequency range of the input signal from the UI 185. After obtaining frequency information, the processor 155 may select an appropriate set of parameters for the operations of the control circuit 140.

Figure 2:
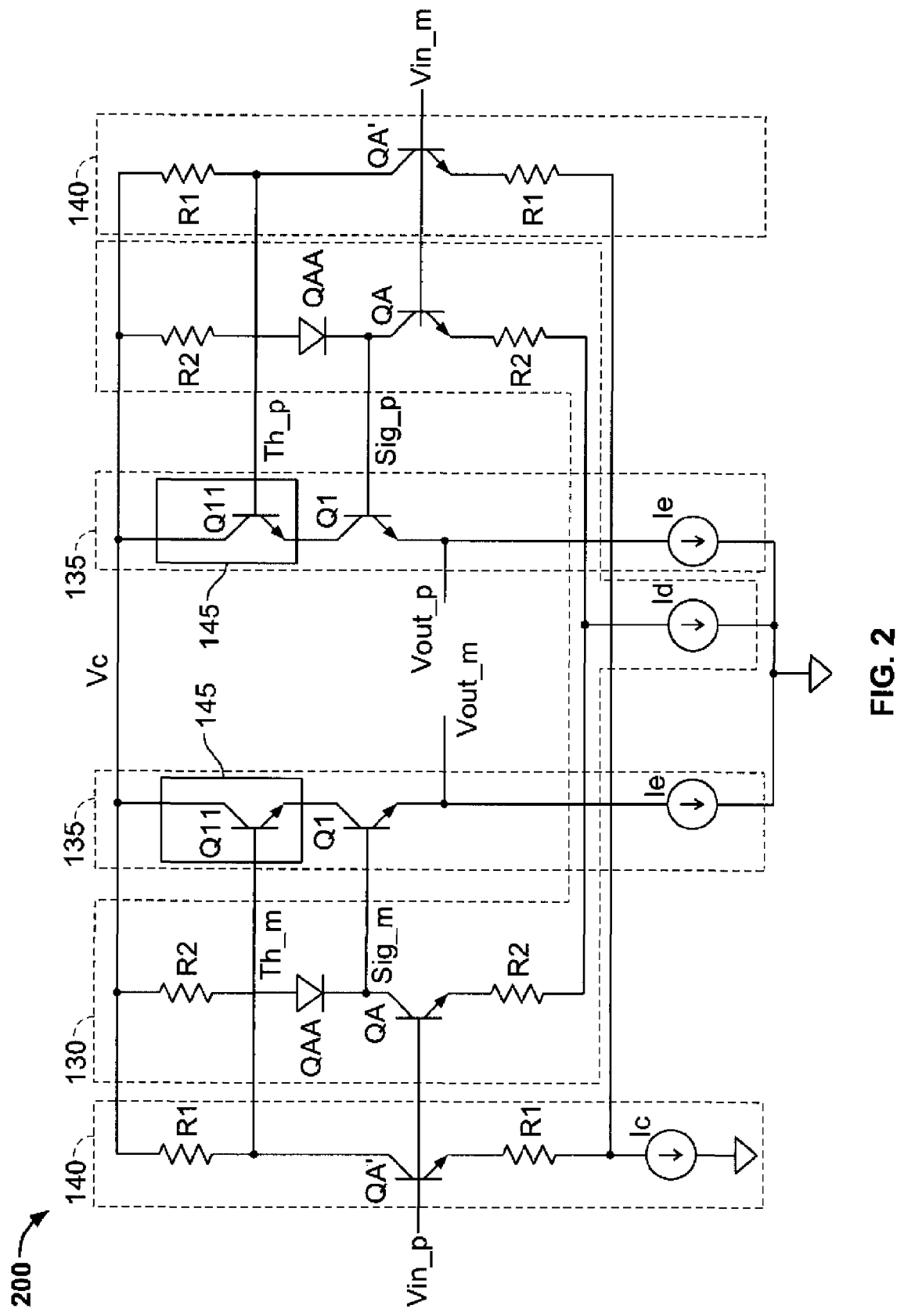
FIG. 2 shows an exemplary electrical schematic of an input stage of a track and hold module that includes the control circuit and the compensation circuit of FIG. 1.

FIG. 2 shows a schematic of an exemplary circuit 200 that illustrates additional details for the amplifying circuit 130, the emitter follower circuit 135, the control circuit 140, and the compensation circuit 145. In another embodiment, the exemplary circuit 200 may be implemented as a corresponding differential amplifier circuit and emitter follower, with two control circuits 140 corresponding to each leg of the differential amplifier (130) and providing thermal tail compensation with improved transient response after current spikes in one or both emitter follower stages, for example. In some embodiments, only a single emitter follower may be user in combination with a differential amplifier.

The circuit 200 receives a signal input Vin_p and transmits a signal output Vout_m to the track and hold circuit 120 (FIG. 1). For example, the Vin_p may be connected to the input port 105 and the Vout_m may be connected to a capacitor through a switch (not shown) in the circuit 120.

The amplifying circuit 130 includes two resistors R2, a diode $Q_{AA}$, a BJT $Q_A$, and a constant current source Id. In this example, the amplifying circuit 130 may amplify an input signal by some gain and transmit the amplified signal Sig_m to the emitter follower circuit 135.

The emitter follower circuit 135 includes a constant current source Ie and an emitter-follower configured BJT Q1. The transistor Q1 has a base that receives the Sig_m signal. The collector of Q1 also connects to an emitter of a BJT Q11, which serves as the thermal tail compensation circuit 145. A base of the transistor Q11 is biased by a thermal compensation signal Th_m from the control circuit 140.

In operation, the control circuit 140 generates the signal Th_m to substantially track variations in the signal Sig_m. In some embodiments, the control circuit 140 is responsive to the input signal Vin_p, and operates to maintain a substantially constant voltage difference between the signals Th_m and Sig_m. Accordingly, power dissipation in the transistor Q1 is maintained at a substantially constant level, thereby mitigating thermal tail effects. In particular, the compensation circuit 145 bootstraps the collector voltage changes of Q1 to the base voltage changes of Q1 to control the collector-to-base voltage of Q1. Accordingly, the bootstrapping contributes to regulating the collector-to-emitter voltage (Vce) of Q1. By controlling Vce of Q1, the compensation circuit 145 may substantially mitigate Vce voltage changes in the emitter follower circuit 135 responsive to voltage changes in the input Vin_p.

The control circuit 140 includes two resistors R1, a BJT $Q_A'$, and an adjustable current source Ic. In the depicted example, the control circuit 140 is powered by the same rail, Vc, that powers the circuits 130, 135.

In some examples, when the emitter follower circuit 135 is switched to charge the capacitor in the track and hold circuit 120 (FIG. 1) to a new voltage level, a surge of current may flow through the emitter follower circuit 135. In some cases, the surge of current may be large enough to cause the intrinsic collector to base voltage (Vcb) to become temporarily (e.g., for 10 ps-50 ps) forward biased unless the extrinsic collector voltage is sufficiently high.

To avoid this saturation condition, the control circuit 140 is configured to bias the compensation circuit 145 so that extrinsic collector voltage at Q1 is high enough so that the effective drop in intrinsic collector voltage is not sufficient to forward bias the collector-to-base junction.

The control circuit 140 may be decoupled in various implementations from the circuits 130, 135. Accordingly, several design options are available for configuring the control circuit 140. For example, resistor values R1 may be selected to optimize power dissipation, noise, voltage level, current consumptions, input signal loading, or other electrical parameters. The current source Ic may be set to a desired that, in combination with the supply voltage and resistors R1, establishes an appropriate operating point for the transistor QA' and a suitable bias point for the signal Th_m. In various embodiments, the elements of the control circuit 140 may be arranged to bias the transistor Q11 with a sufficiently high voltage that the transistor Q1 is not saturated during operation, including worst-case transient current operating conditions.

The adjustable current source Ic may control the voltage output on Th_m. For example, for known values of resistances of R1 and R2, as well as the constant current of Id, the processor 155 may provide an appropriate control signal to adjust the output current of Ic to set the voltage of Th_m. In some embodiments, the processor 155 may adjust Ic to account for changes in circuit characteristics over temperature. Power consumption may be reduced, for example, if Ic can be reduced.

When necessary to prevent saturation, Ic may be adjusted (increased or decreased) by the processor 155. For example, saturation may be detected by monitoring the output of the acquisition module 10 to a test pattern signal. Testing may be performed during the manufacturing process and/or during a product lifetime, such as during periodic self characterization or self testing of the digital oscilloscope 100. If saturation of the emitter follower is detected, the processor 155 may incrementally adjusted Ic. Self-characterization testing may be repeated and Ic adjusted until saturation is no longer detected. Operating parameters, such as the optimal value of Ic along with a current temperature measurement, may be stored in the NVM 175.

Figure 3:
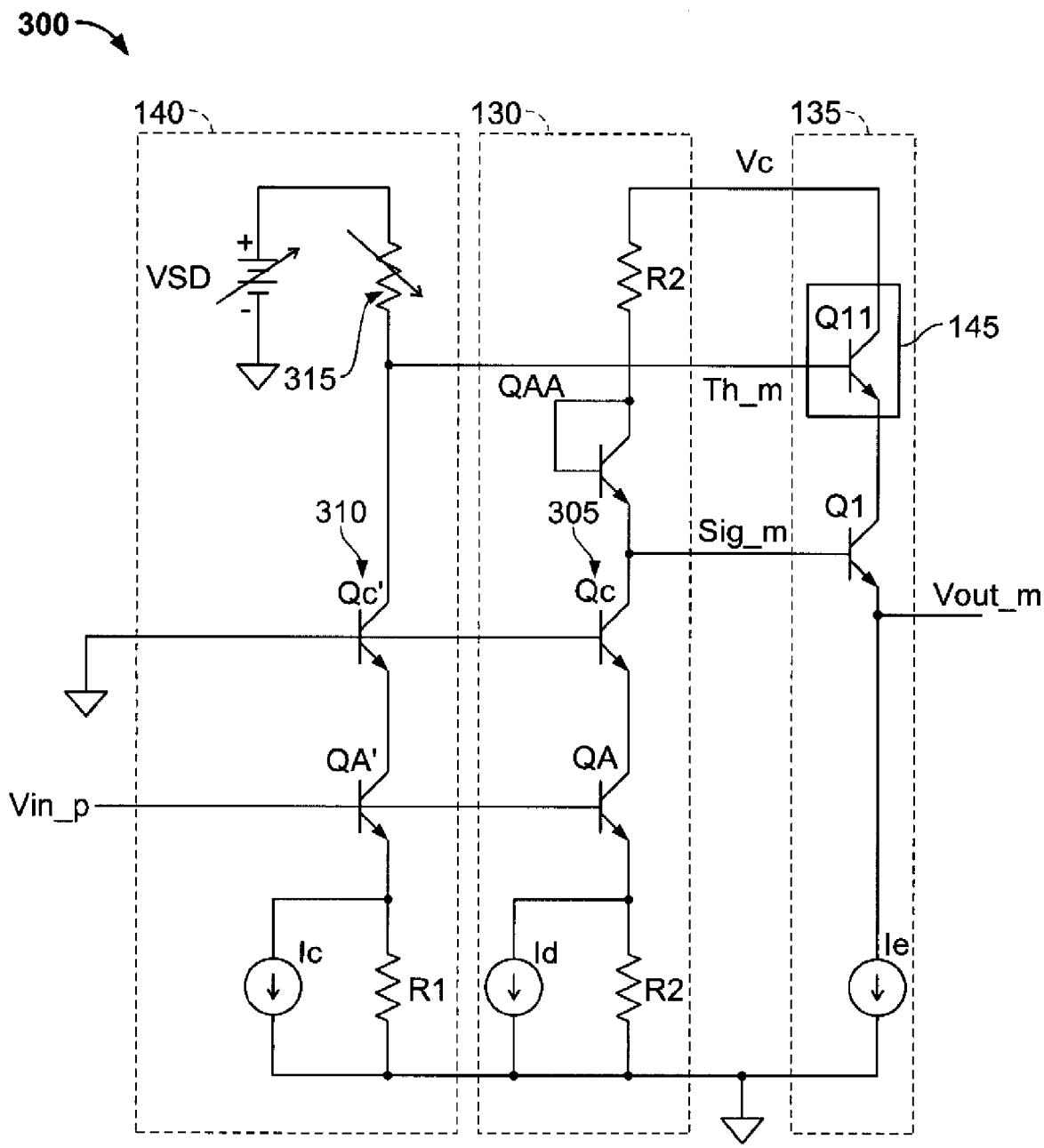
FIG. 3 is a schematic of an exemplary input stage of a track and hold module with an adjustable voltage supply and an adjustable resistor in the control circuit.

FIG. 3 shows a schematic of another embodiment of a circuit 300 that includes the amplifying circuit 130, the emitter follower circuit 135, the control circuit 140, and the compensation circuit 145.

In this example, the amplifying circuit 130 and the control circuit 140 include cascode circuits 305, 310, respectively. In some embodiments, the cascode circuits 305, 310 act as current buffers and contribute to reduced miller capacitance effects on the input amplifiers, thereby increasing bandwidth. In this example, the cascode circuits 305, 310 may prevent very high Vce of $Q_A'$ that could induce breakdown of $Q_A'$ and $Q_A$. The presence of cascode transistor 310 in the circuit 300 may make the thermal tail in the control circuit 140 relatively independent of the voltage at the collector of $Q_c'$ 310, thus yielding some flexibility in biasing the control circuit 140. In some embodiments, the cascode circuits 305, 310 may improve the performance of the compensation circuit 145 by generating the Th_m signal that closely tracks variations in the Sig_m signal over a wide bandwidth, including at least frequencies at which thermal tail effects are significant.

In the circuit 300, the control circuit 140 is biased by a controllable voltage source VSD, which may be substantially independent of the voltage rail Vc. In typical practical integrated circuits, the available voltage headroom between the rail voltages, in this case Vc and ground, is often limited by biasing and control circuits (not shown). In such applications, providing an independently biased control circuit 140 facilitates applying a voltage level on the Th_m signal that can reduce the possibility of forward biasing the collector-base junction of the Q1 transistor. The voltage level may be below, above, or substantially equal to the rail voltage Vc. In some implementations, a complementary configuration may include PNP transistors and a negative voltage source VSD. In some embodiments, the voltage source VSD may be substantially fixed, such as by component selection or laser trimming at manufacturing time.

In some embodiments, the output voltage of the VSD can be externally generated and controlled by the processor 155 to adjust the bias voltage level of the Th_m signal to the compensation circuit 145. In various embodiments, the VSD voltage source may be controlled and/or provided external to, internal to, or a combination thereof, an integrated circuit (IC) that contains the emitter follower 135 and/or the amplifier 130. The VSD may be controlled by a controllable voltage reference, for example, that sets the output voltage of an operational amplifier, voltage source, or other voltage regulation circuit. In some examples, a controllable linear and/or switch mode power supply may directly or indirectly be controlled to provide the voltage source VSD. Similarly, the controllable current source Ic in the control circuit 140 may be implemented external to, internal to, or a combination thereof, an integrated circuit (IC) that contains the emitter follower 135 and/or the amplifier 130. In some implementations, the Ic may be implemented at a lower voltage than available as the lower rail voltage (e.g., ground) supplied to the amplifier 130 and the emitter follower 135.

In an illustrative example, the processor 155 may execute a test code in the acquisition module 110 and measure the voltage of the Th_m signal ($V_{Th\_m}$) and the Sig_m signal ($V_{sig\_m}$). Then, by comparing $V_{Th\_m}$ and $V_{sig\_m}$, the processor 155 may adjust the VSD and/or Ic to reduce tracking errors between $V_{Th\_m}$ and $V_{sig\_m}$, for example, while providing sufficient voltage to substantially prevent saturation of the transistor Q1.

The circuit 300 also includes an adjustable resistor 315, which may also be used to control $V_{Th\_m}$. In some embodiments, the adjustable resistor 315 may be implemented with switches and parallel connected resistances. As an example, the processor 155 may operate a multiplexer to adjust resistance of the resistor 315 to control $V_{Th\_m}$. In some embodiments, the processor 155 may adjust the voltage output of the VSD in discrete units to fine tune $V_{Th\_m}$ in combination with the adjustable resistor 315 and/or the adjustable current source Ic. For example, the VSD may supply output voltage of about 1, 2, 3, ..., 10 Volts. After setting an output voltage Vs of the VSD, the processor 155 may fine tune $V_{Th\_m}$ by adjusting Ic and the resistance of the resistor 315.

In various embodiments, the VSD, the resistor 315, and/or the Ic may be implemented, in whole or in part, either in an integrated circuit (IC) on the same die as the circuits 130 and/or 135, or external to an IC. The VSD and or Ic sources may be received, for example, from a controllable digital to analog converter, linear regulator, adjustable voltage/current regulator, op-amp, selected voltage reference, current mirror, or other voltage/current source, which may or may not be implemented in the same package as the circuits 130, 135. The resistor may be adjustable by connection to an external circuit, which may include fixed and/or processor-controllable elements (e.g., multiplexer). In an embodiment, a default fixed circuit in an IC may be supplemented with external components and/or input signals to provide for adjustable operation. In an embodiment, one or more controlled parameters may be manipulated by commands through a JTAG port on an IC.

Figure 4:
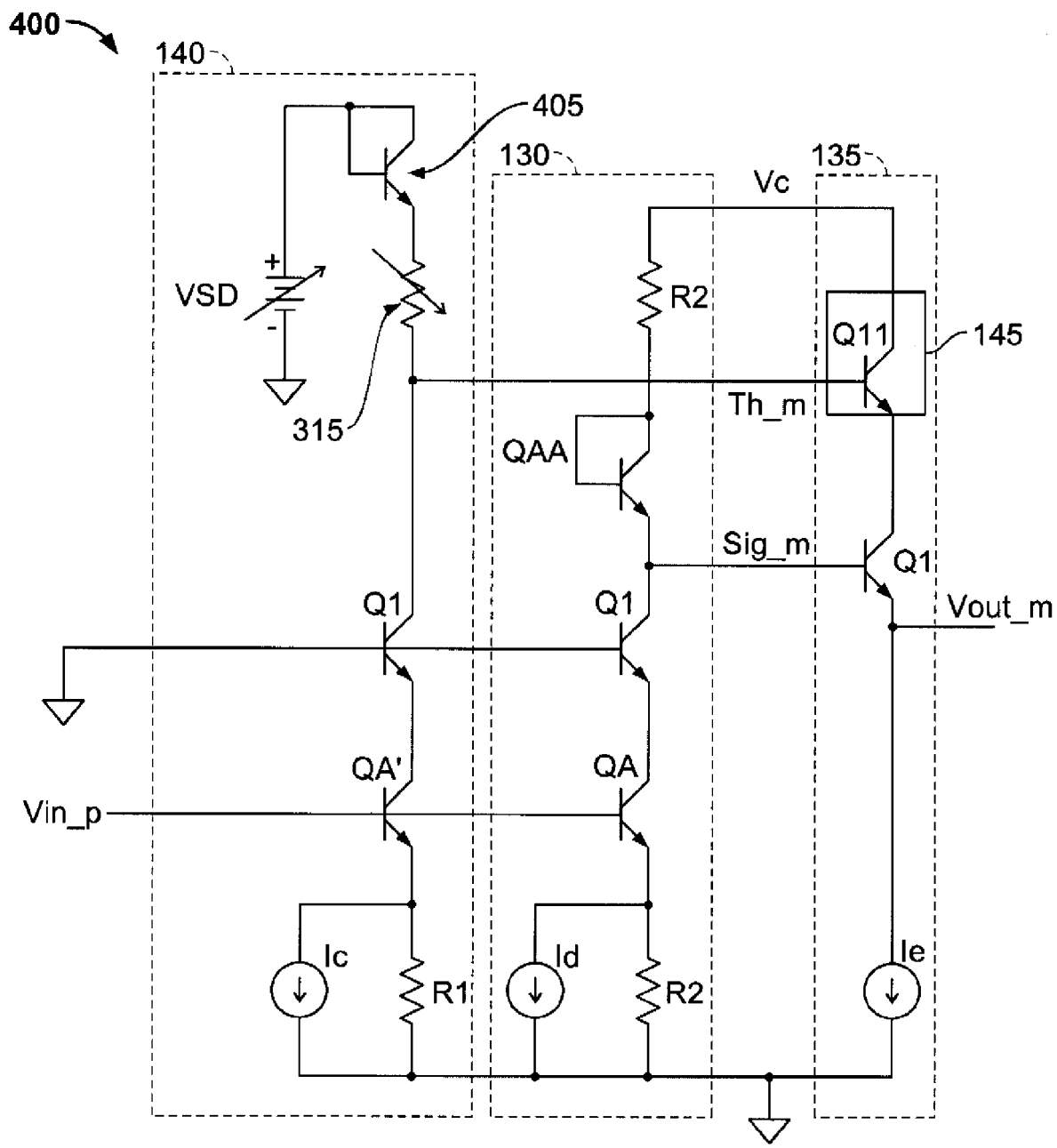
FIG. 4 is a schematic of an exemplary input stage of a track and hold module with a diode load in the control circuit.

FIG. 4 shows another schematic of another embodiment of a circuit 400 that includes the amplifying circuit 130, the emitter follower circuit 135, the control circuit 140, and the compensation circuit 145. The circuit 400 includes a diode load 405 between the power supply VSD and the adjustable resistor 315.

With the presence of a diode load 405, the voltage gain of the control circuit 140 can closely match the voltage gain of the amplifying circuit 130, and thus provide an accurate representation of the amplifier 130 output signal Sig_m on the control circuit 140 output signal Th_m. In some examples, the amplifier 130 may be configured as a differential stage amplifying the current through each leg of the differential stage of the amplifier 130 according to changes in the input. The Vbe of the $Q_{AA}$ transistor may vary with current according to changes in the input Vin_p. This Vbe variation may cause some mismatch between Th_m and Sig_m. The diode load 405 and the $Q_{AA}$ may have similar variations in Vbe with changes in current due to changes in the input Vin_p. In some embodiments, thermal tails of the control circuit 140 may be matched with thermal tails of the amplifier 130. In cases where biasing the current Ic of the control circuit 140 doesn't match the current of the amplifier 130 and/or the resistor values differ, the thermal tails may be adjusted by controlling the current density of the thermal tail producing elements (e.g., transistors) in the control circuit 130 and the thermal compensation circuit 145. Improved thermal matching may correspond to better tracking between the signals Th_m and Sig_m.

Although an exemplary system has been described with reference to FIG. 1, other implementations may be deployed in other industrial, scientific, medical, commercial, and/or residential applications. Embodiments may be applied in oscilloscopes including, but not limited to, sampling oscilloscopes, digital storage oscilloscopes, real time oscilloscopes, near real time oscilloscopes, and analog oscilloscopes, for example. Acquisition techniques may involve various synchronous, single shot, and/or asynchronous sampling techniques including, but not limited to, sequential sampling, random interleaved sampling, coherent interleaved sampling, for example. Embodiments may be applied in, for example, signal conditioning and/or acquisition functions in IC's, ASICs, and/or chipsets.

The control circuit 140 and the compensation circuit 145 may also be used in other applications that have signal in frequency ranges in which thermal tail effects can induce signal distortion, increase settling time, such as, by way of example and not limitation, between DC and about 100 MHz, for example. For example, the control circuit 140 and the compensation circuit 145 may also be used in buffering circuits in which current surges and/or high rates of change of output voltage may occur. The control circuit 140 and the compensation circuit 145 may be used in an input amplifier of an audio and/or video recorder. Some embodiments may be applicable in signal conditioning applications, or in other applications that operate in a frequency range in which thermal tail effect may affect performance.

In some embodiments, the circuits may be implemented as integrated components on a common substrate, common die, or common package in an integrated circuit (e.g., on a chip). In other embodiments, some or all of the control circuit, for example, may be implemented off-chip, either in the same package or external to the package. Externally implemented components may be integrated, discrete, or a combination thereof. In some embodiments, one or more signals may be supplied to the control circuit from off-chip.

Although exemplary implementations are given by using NPN bipolar junction transistors (BJTs) in an emitter follower circuit, with proper rearrangement of the electronic components, other applications are possible. For example, PNP BJTs can also be used. Embodiments may be implemented in devices or systems that also incorporate BiCMOS, JFET, MOSFET, and similar technologies. In a further example, various embodiments may be transformed into a dual circuit that may operate from a negative supply voltage. In some other embodiments, the output stage may include one or more transistors in a common collector, common base, common emitter, darlington, or a combination of such configurations, as appropriate.

In various embodiments, a compensation circuit substantially reduces signal settling time and/or distortion associated with large amplitude current transients in a voltage follower. In one embodiment, a control circuit may bias a circuit that provides thermal tail compensation for a transistor configured as a source follower. In such embodiments, the bias signal may operate the compensation circuit (i) to maintain a substantially constant power condition in a source follower transistor to substantially reduce thermal tail effects, and (ii) to maintain the source follower, for example, in a triode operating condition. In one embodiment, a source follower transistor may be, for example, a metal oxide semiconductor field effect transistor (MOSFET). In a different embodiment, a source follower transistor may be, for example, a junction field effect transistor (JFET).

The amplifying circuit 130 may be a voltage amplifier, current amplifier, or other amplifiers with a fixed or variable gain. Although one exemplary embodiment is described with one emitter follower, the emitter follower circuit 135 may include more than one emitter follower, for example, to better isolate the amplifier 130 from loading effects on the last emitter follower stage. In some embodiments, the amplifying circuit 130 may amplify and buffer the input signal. The amplifying circuit 130 may also shift the level (e.g., current level, voltage level, etc.) of the input signal. In some embodiments, the amplifying circuit 130 may reduce noise from the input signal. For example, the amplifying circuit 130 may be a differential amplifier that may filter common-mode noise by common-mode rejection.

Some systems may be implemented as a computer system that can be used with implementations of the invention. For example, various implementations may include digital and/or analog circuitry, computer hardware, firmware, software, or combinations thereof. Apparatus can be implemented in a computer program product tangibly embodied in an information carrier, e.g., in a machine-readable storage device or in a propagated signal, for execution by a programmable processor; and methods can be performed by a programmable processor executing a program of instructions to perform functions of the invention by operating on input data and generating an output. The invention can be implemented advantageously in one or more computer programs that are executable on a programmable system including at least one programmable processor coupled to receive data and instructions from, and to transmit data and instructions to, a data storage system, at least one input device, and/or at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, which may include a single processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including, by way of example, semiconductor memory devices, such as EPROM, EEPROM, and flash memory devices; magnetic disks, such as internal hard disks and removable disks; magneto-optical disks; and, CD-ROM and DVD-ROM disks. The processor and the memory can be supplemented by, or incorporated in, ASICs (application-specific integrated circuits).

In some implementations, each system may be programmed with the same or similar information and/or initialized with substantially identical information stored in volatile and/or non-volatile memory. For example, one data interface may be configured to perform auto configuration, auto download, and/or auto update functions when coupled to an appropriate host device, such as a desktop computer or a server.

In some implementations, one or more user-interface features may be custom configured to perform specific functions. The invention may be implemented in a computer system that includes a graphical user interface and/or an Internet browser. To provide for interaction with a user, some implementations may be implemented on a computer having a display device, such as a CRT (cathode ray tube) or LCD (liquid crystal display) monitor for displaying information to the user, a keyboard, and a pointing device, such as a mouse or a trackball by which the user can provide input to the computer.

In various implementations, the system 100 may communicate using suitable communication methods, equipment, and techniques. For example, the system 100 may communicate with compatible devices (e.g., devices capable of transferring data to and/or from the system 100) using point-to-point communication in which a message is transported directly from the source to the receiver over a dedicated physical link (e.g., fiber optic link, point-to-point wiring, daisy-chain). The components of the system may exchange information by any form or medium of analog or digital data communication, including packet-based messages on a communication network. Examples of communication networks include, e.g., a LAN (local area network), a WAN (wide area network), MAN (metropolitan area network), wireless and/or optical networks, and the computers and networks forming the Internet. Other implementations may transport messages by broadcasting to all or substantially all devices that are coupled together by a communication network, for example, by using omni-directional radio frequency (RF) signals. Still other implementations may transport messages characterized by high directivity, such as RF signals transmitted using directional (i.e., narrow beam) antennas or infrared signals that may optionally be used with focusing optics. Still other implementations are possible using appropriate interfaces and protocols such as, by way of example and not intended to be limiting, USB 2.0, Firewire, ATA/IDE, RS-232, RS-422, RS-485, 802.11 a/b/g, Wi-Fi, Ethernet, IrDA, FDDI (fiber distributed data interface), token-ring networks, or multiplexing techniques based on frequency, time, or code division. Some implementations may optionally incorporate features such as error checking and correction (ECC) for data integrity, or security measures, such as encryption (e.g., WEP) and password protection.

In an illustrative example, an independently controllable compensation circuit is configured to adjust a voltage supplied to an output stage that is coupled to a sampling circuit, wherein the compensation circuit substantially reduces or eliminates some short-term saturation effects. In some cases, some of these effects may be referred to as quasi-saturation effects that, under some circumstances, may be associated with large amplitude current transients in bipolar junction transistors (BJTs). In an illustrative example, a control circuit may bias a circuit that provides thermal tail compensation for a transistor configured as an emitter follower.

A number of implementations of the invention have been described. Nevertheless, it will be understood that various modifications may be made without departing from the spirit and scope of the invention. For example, advantageous results may be achieved if the steps of the disclosed techniques were performed in a different sequence, if components in the disclosed systems were combined in a different manner, or if the components were replaced or supplemented by other components. The functions and processes (including algorithms) may be performed in hardware, software, or a combination thereof, and some implementations may be performed on modules or hardware not identical to those described. Accordingly, other implementations are within the scope of the following claims.

What is claimed is:

1. A waveform processing system comprising:
   a channel to receive an input signal;
   a converter coupled to the channel to convert the input signal to a digital representation, wherein the converter comprises:
      an amplification stage to condition the input signal;
      an output stage comprising a transistor configured to receive the conditioned signal as an input; and,
      a compensation circuit to adjust a voltage supplied to the output stage, wherein the supplied voltage is controlled to substantially maintain constant power dissipation in the output stage, and wherein the compensation circuit is configurable independently from the amplification stage.

2. The system of claim 1, wherein the amplification stage comprises a differential amplifier.

3. The system of claim 1, wherein the amplification stage comprises a single-ended amplifier.

4. The system of claim 1, wherein the output stage transistor is configured as an emitter follower.

5. The system of claim 4, wherein the compensating circuit is further configured to substantially prevent saturation of the emitter follower transistor in an event of large amplitude current spikes through the transistor.

6. The system of claim 4, wherein the compensating circuit is further to adjust the supplied voltage to level sufficient to prevent saturation of the transistor.

7. The system of claim 6, wherein the compensating circuit adjusts the supplied voltage to level that is substantially higher than the conditioned input signal.

8. The system of claim 1, wherein the compensation circuit comprises a controllable current source.

9. The system of claim 1, wherein the compensation circuit comprises a controllable voltage source.

10. The system of claim 1, wherein the compensation circuit comprises a controllable resistance.

11. The system of claim 1, further comprising means for sampling an output signal of the output stage.

12. The system of claim 11, wherein the sampling means comprises a substantially capacitive load selectively coupled to an output of an emitter follower through a switch.

13. The system of claim 1, further comprising a processor operatively coupled to the compensation circuit and to a data store containing instructions that, when executed by the processor, cause the processor to perform operations to detect saturation of an emitter follower transistor.

14. The system of claim 13, wherein the operations further comprise adjusting an input to the compensation circuit to cause an increase in a magnitude of the supplied voltage in response to detecting saturation of the transistor.

15. The system of claim 1, further comprising a digital oscilloscope that includes the channel and the converter.

16. A method of processing signals in a waveform processor, the method comprising:
   receiving an input signal;
   amplifying the received signal in an amplifier;
   buffering the amplified signal with a transistor;
   generating a feedforward signal (i) that substantially tracks variations in the amplified signal over a frequency range of interest and (ii) that is biased to a DC voltage that is substantially offset from the amplified signal, wherein the feedforward signal is decoupled from an output of the amplifier;
   applying the feedforward signal to the transistor, wherein the feedforward signal has sufficient offset to substantially prevent the transistor from saturating in response to a current spike; and
   transmitting an output signal from the transistor to a sampling circuit.

17. The method of claim 16, wherein the transistor is configured as an emitter follower, and applying the feedforward signal to the transistor comprises applying the feedforward signal to a collector of the transistor.

18. The method of claim 16, wherein the transistor comprises a NPN bipolar junction transistor.

19. The method of claim 16, wherein the transistor comprises a PNP bipolar junction transistor.

20. The method of claim 19, wherein the feedforward signal is substantially offset to a DC voltage that is substantially lower than the amplified signal.

21. The method of claim 16, further comprising adjusting the feedforward signal in response to a saturation condition of the transistor.

22. A waveform processor comprising:
   an amplifier;
   an output stage coupled to the amplifier;
   a sampling circuit coupled to the output stage; and,
   means for compensating the output stage by adjusting a voltage supplied to the output stage so as to substantially maintain constant power dissipation in the output stage, wherein the compensating means is configurable independently from the amplifier.

23. The waveform processor of claim 22, wherein the output stage comprises a transistor configured as an emitter follower.

* * * * *